United States Patent
Wu

(10) Patent No.: US 6,569,360 B2
(45) Date of Patent: May 27, 2003

(54) METHOD OF PREPARING METAL MATRIX COMPOSITE WITH TEXTURED COMPOUND

(76) Inventor: Hengning Wu, 11627 N. Shore Dr. 2B, Reston, VA (US) 20190

( * ) Notice: Subject to any disclaimer, the term of this patent is extended or adjusted under 35 U.S.C. 154(b) by 0 days.

(21) Appl. No.: 10/064,556

(22) Filed: Jul. 25, 2002

(65) Prior Publication Data

US 2002/0198109 A1 Dec. 26, 2002

Related U.S. Application Data

(63) Continuation-in-part of application No. 09/659,218, filed on Sep. 11, 2000, now Pat. No. 6,265,354.
(60) Provisional application No. 60/309,141, filed on Jul. 31, 2001.

(51) Int. Cl.$^7$ .............................. H01L 39/24; H01B 1/00
(52) U.S. Cl. ................... 252/518.1; 252/518.1; 505/120; 505/121; 505/124; 29/599; 174/125.1; 174/126.2; 174/129 R
(58) Field of Search ................... 252/518.1; 29/599; 505/120, 121, 124; 174/125.1, 126.2, 129.6

(56) References Cited

U.S. PATENT DOCUMENTS

| | | | |
|---|---|---|---|
| 5,037,801 A | * 8/1991 | Kloucek ................ 505/430 |
| 5,086,034 A | 2/1992 | Balachandran et al. |
| 5,096,879 A | 3/1992 | Arendt |
| 5,288,679 A | 2/1994 | Su |
| 5,356,868 A | * 10/1994 | Naito et al. ................ 505/126 |
| 5,395,821 A | 3/1995 | Kroeger et al. |
| 5,614,472 A | 3/1997 | Riddle et al. |
| 5,863,867 A | 1/1999 | Sengupta et al. |
| 6,202,287 B1 | 3/2001 | Otto |

FOREIGN PATENT DOCUMENTS

WO  WO 01/22436 A1  3/2001

OTHER PUBLICATIONS

D. Finnemore et al., Review on Coated Superconductors, Physica C, 1999, 320, p1.
David C. larbalestier, The Road to Conductors of High Temperature Superconductors:10 Years Do Make a Difference!, IEEE Trans. on Applied Superconductivity vol. 7, No. 2,, 1997, 90–97.
H. Kitaguchi and H.Kumakura, Advance in Bi–based high Tc Supperconducting Tapes and Wires, MRS Bulletin, Feb. 2001, p121–125.
S. Annavarapu et al., Progress Towards a Low–cost Coated Conductor Technology, Physica C, 2000, 341–348, p2319–2322.
L.R. Motowildlo et al., Recent Progress in High–temperature Superconductors at Intermagnetics General Corporation, Physica C, 2000, 335, p44–50.
R.L. Meng et al., Tape processing of HBCCO, BSCCO, and YBCO Thick films on Metallic Substrates with High Jc by the Spray/Compress Technique, Physica C, 2000, 341–348, p2315–2318.

(List continued on next page.)

Primary Examiner—Yogendra N. Gupta
Assistant Examiner—Kallambella Vijayakumar

(57) ABSTRACT

The present invention provides a generic method of preparing a metal matrix composite with a textured compound. A "roller-skate" structure starting powder with a mixture of plate-like particles and smaller particles provides better flow compatibility, higher packing density, better densification and texture formation in preparing a metal matrix composite with a textured compound. In particular, the invention provides a method of preparing a textured superconducting composite wire with an improved critical current density.

25 Claims, 2 Drawing Sheets

OTHER PUBLICATIONS

M. Zhou et al., Properties of YBa2Cu3Ox films on textured Ag tapes, Physica C, 2000, 337, p101–105.

S.P. Athur, et al., Melt–processing of Yb123 tapes, Physica C, 2000, 341–348, p2421–2424.

Y. Nemoto, et al., Fabrication of Bi2212 Superconductor using Ag/Ni Clad Tape as Low Cost Substrate, Physica C, 2000, 339, p209–213.

H. Miao et al., Fabrication of High Current Carrying Bi–2212/Ag Superconducting Tapes by the Pre–Annealing and Cold Rolling Process, Cryogenics, 1998, 38, p257–259.

S. Patnaik et al., Electronic anistropy, magnetic field–temperature phase diagram and their dependence on resistivity in c–axis oriented MgB2 thin films, Supercond. Sci. Technol., 2001, 14, p315–319.

M. Kambara, et al., High intergranular critical currents in metallic MgB2 superconductor, Supercond. Sci. Technol., 2001, 14, p L5–7.

B.A. Glowacki, et al., Superconductivity of powder–in–tube MgB2 wires, Supercond. Sci. Technol., 2001, 14, p 193–199.

Jin, S. , Mavoori, J. , Bower, C. & Van Dover, R.B., High critical currents in iron–clad superconducting MgB2 wires. Nature, 2001, 411, p563–565.

A. Sobha, et al., Phase evolution, microstructure and transport property of (Bi,Pb)–2223/Ag tapes prepated using powders of varying particle size distribution, Supercond. Sci. Technol., 2001, 14, p 417–424.

T.T. Tan et al., Characteristics of micro–texture and meso–texture in (Bi,Pb)2Sr2Ca2CuCO10 superconducting tapes, Supercond. Sci. Technol., 2001, 14, p 471–478.

J.W. Anderson et al., The effect of wire drawing and cold rolling on the precursor 2212 phase texture and its subsequent influence on the (Bi,Pb)2Sr2Ca2Cu3Ox texture in Ag–clad tapes, IEEE Trans. in Applied Superconductivity vol. 7, No. 2,, 1997, p 1422–1425.H. Wu,et al., Mechanism for flux pinning in $NdBa_2Cu_3O_{7-?}$ melt–textured in low oxygen partial pressure, Appl. Phys. Lett., 1997, 71, p3572.

J.A. Lewis and M. Wegmann, Transport properties of mangetic field/liquid assisted textured YBa2Cu3O7–x thick films, Appl. Phys. Lett., 1995, 67 (20), 3028–3031.

G. Grasso, A. Malagoli, C. Ferdeghini, S.Roncallo, V. Braccini and A. S. Siri,, Large transport critical currents in unsintered MgB2 superconducting tapes.

Kijoon H. P. Kim, et a., Superconducitng properties of well–shaped MgB2 single crystal, http://arxiv.org/archive/cond–mat, 2001, cond–mat/0105330.

* cited by examiner

METHOD OF PREPARING METAL MATRIX COMPOSITE WITH TEXTURED COMPOUND

CROSS REFERENCE TO RELATED APPLICATIONS

This application is a continuation-in-part of application 09/659,218, filed Sep. 11, 2000, now U.S. Pat. No. 6,265,354, granted Jul. 24, 2001.

BACKGROUND OF INVENTION

The present invention relates to a method of preparing a metal matrix composite material with a textured compound. In particular, it relates to a method of preparing a textured superconducting composite wire.

Some important advanced materials have layered structures. For example, high temperature oxide superconductors and the superconducting intermetallic compound $MgB_2$ are materials with a layered structure. The layered structure causes the anisotropy in physical properties, and texture formation is necessary to achieve superior performance. As the layered compounds are brittle, the layered compounds are often prepared as metal matrix composites to provide better mechanical properties.

One well-known method to prepare such composite materials is the "powder-in-tube" method. This method has been used to prepare the low temperature superconducting compound $Nb_3Sn$, the high temperature oxide superconductors, and the recently discovered intermetallic compound $MgB_2$. According to the formation of the compound in the powder-in-tube method, the method is also classified into two categories: the in situ technique and the ex situ technique. For the in situ technique, the components in the elemental forms are used as the starting powder, and the compound is formed inside the tube after mechanical deformation of the composite wire. For the ex situ technique, a powder of the compound is used as the starting powder.

For the high temperature oxide superconductors, both metal precursor and oxide precursor were tested, and the best results so far were achieved with the Bi2223 and Bi2212 prepared by the oxide powder-in-tube method (See, for example, a summary by D. Larbalestier, "The road to conductors of high temperature superconductors: 10 years do make a difference", IEEE Trans. Appl. Supercond. 7(2) 1997, p90–97. Also refer to a review by H. Kitaguchi and H. Kumakura, "Advance in Bi-based high $T_c$ Superconducting Tapes and Wires", MRS BULLETIN, February 2001, p121–125). This is attributed to the weakly-bonded, double Bi—O layer in the structures. The easy cleavage between the Bi—O layers introduces texturing of the phase in the deformation process. Attempts to make superconducting wires for the rare earth 123 compounds have not been very successful in achieving a high critical current density for the powder-in-tube methods. For a recent effort in this area, refer to U.S. Pat. No. 6,202,287 by A. Otto which describes an attempt to make a bi-axially aligned 123 wire from a metallic precursor powder Although the melt-texture growth method has produced high critical current densities in bulk RBaCuO-123 superconductors, the very slow growth rate is not practical for the production of long length wires. Current efforts for the rare earth 123 compounds have been focused on the coated thin-film conductors (See a review by Finnemore et al., Physica C, 320, 1999, 1). Other related developments are discussed in the following references: S. Annavarapu et al., "Progress Towards a Low-cost Coated Conductor Technology", Physica C, 341–348, 2000, p2319–2322; L. R. Motowildlo et al., "Recent Progress in High-temperature Superconductors at Intermagnetics General Corporation", Physica C, 335, 2000, p44–50; R. L. Meng et al., "Tape processing of HBCCO, BSCCO, and YBCO Thick films on Metallic Substrates with High $J_c$ by the Spray/Compress Technique", Physica C, 341–348, 2000, p2315–2318; M. Zhou et al., "Properties of $YBa_2Cu_3O_x$ films on textured Ag tapes", Physica C, 337, 2000, p101–105; S. P. Athur et al., "Melt-processing of Yb123 tapes", Physica C, 341–348, 2000, p2421–2424.

Besides the powder-in-tube method, there are many other methods for the preparation of a metal matrix composite. Thin film methods have been used to prepare all types of superconducting materials mentioned above either through physical deposition or chemical deposition. Dip coating has been used to form a layer of compound on a metal substrate. The present invention is related to a bulk method using a powder as the starting material for a layered compound.

The challenges in preparing a composite with a textured compound by a powder method include:

(a) The flow compatibility of the metal and the powder. Poor compatibility will cause difficulty in the deformation process and the formation of sausage in the composite.

(b) Powder packing. A high powder density before sintering is preferred.

(c) Densification. The decrease in density of Bi2223 during heat treatment seems to be mainly caused by the growth of non-aligned oxide grains. International Application Publication WO 01/22436A1 by Li et al., entitled "Simultaneous constraint and phase conversion processing of oxide superconductors", and the references cited disclose various ways to apply pressure during various stages of heat treatment to deal with the desintering problem to certain degree of success.

(d) Texture formation. It is desirable to develop a high degree of texture in the layered compound. For certain superconducting materials with grain boundary weak link problems, good grain boundary connectivity is also required. In the prior art, texture in Bi2212 is formed through a melt-texture growth method.

Texture in Bi2223 depends on the rolling deformation and the easy cleavage of the 2212 phase. Therefore, a high critical current density is obtained only in the tape form for Bi2223. However, round wire or wires with a low aspect ratio are more desirable for many applications.

A processing method should provide solutions to all the challenges simultaneously in order to be commercially viable. Although superconductors, and especially superconducting wires, are used as examples in the following discussion, the present invention should be applicable to other metal matrix composites with textured compounds.

SUMMARY OF THE INVENTION

Therefore, an object of the present invention is to provide a method of preparing metal matrix composite with a textured compound, which has better flow compatibility, higher packing density, better densification and texture formation. As a result, improved performance of the compound will be obtained.

Another object of the present invention is to provide a method of preparing composite wires of layered superconducting materials with a better processing condition and improved superconducting properties such as a high critical current density.

Still another object of the present invention is to provide a method of preparing composite wires of layered superconducting materials with a low aspect ratio.

Still another object of the present invention is to provide a method of preparing bulk layered superconducting materials with improved superconducting properties.

According to the present invention, the starting powder for preparing a layered compound should comprise of (a) A plate-like powder of the layered compound or an intermediate phase (metastable phase) for the layered compound which retains its shape at least at the initial sintering stage. This plate-like powder serves as the template for texture formation of the layered compound. The "plate-like powder", as the term used in this specification, has a phase with a layered structure and the particles have a minimum basal plane dimension that is at least 1.62 times greater than the thickness dimension. The minimum basal plane dimension is the shortest line segment on the basal plane through its geometry center, which is the diameter of a circular shape, the side length of a square, or the length of the shorter side of a rectangular. Because of the natural variation in powder preparation, it should be understood that the majority (>50% by volume) of the particles should meet the requirement, and preferably 80%, and more preferably 90% of the particles should meet the requirement.

(b) The remaining powder with a particle size smaller than half the median minimum basal plane dimension of the plate-like powder. Preferably this powder has a near-sphere shape, or the dimensions in different directions are similar. This second powder may contain any phases which in combination with the first powder and under certain heat treatment will form the desired final compound. Suitable phases include, but are not limited to, pure metals, alloys, intermediate compounds, and the final compound.

In the prior art, two types of powder are used (FIG. 1A and FIG. 2A). The powder shown in FIG. 1A has predominantly equal-axial or near-sphere particles. This may correspond to a well-ground uniform fine powder. This type of powder has good deformation behavior, and therefore has relatively good flow compatibility with the metal sheath. However, the powder has a low packing density and a low tendency for texture formation (FIG. 1B). The powder shown in FIG. 2A has a predominantly plate shaped particles. This powder has poor flow compatibility with the metal sheath and a low packing density (FIG. 2B). Although it has a good tendency for texture formation during the deformation process, the low packing density makes sintering difficult, and the poor deformation behavior makes the wire prone to sausage formation. Although real powders have some deviations, the powder structures in FIGS. 1A–B and FIGS. 2A–B are representative of the predominant features of the powders in the prior art for the preparation of metal matrix composites.

A well-known technique to improve powder packing density in ceramics is illustrated in FIGS. 3A–B. The basic principle is to fill the voids of the previous close packed structure with spheres of suitable sizes. The process can be repeated to several levels of voids and a high packing density of around 95% theoretical density may be obtained. When this powder is used to make a metal matrix composite wire, good flow compatibility and a high packing density would be predicted. For a compound with an easy cleavage tendency such as Bi-based oxide superconductors, a high level of texture formation can be obtained in the rolling process to form a composite tape. However, desintering may occur during the sintering process partially due to the growth of certain misaligned grains. For a compound that will not cleave easily during the rolling process, texture formation is very limited.

The proposed powder structure according to the present invention is shown in FIGS. 4A–B. The raw powder is shown in FIG. 4A, and the structure shown in FIG. 4B may represent the powder at a later stage of deformation when the initially randomly distributed plate-like particles are aligned in the deformation process. Owing to the unique "roller-skate" structure of the powder, a good deformation behavior and a high packing density are both obtained. A high packing density means that the relative density is at least 70%, more preferably 80%, and most preferably 90%. The plate-like particles, acting like the "board" of a "roller-skate", can slide easily on the smaller particles acting as "rollers". The roller particles are preferably near-sphere in shape. When the roller particles are much smaller in size (say less than 10% of the size of plate-like particles), the shape factor becomes less important. The "roller-skate" powder structure artificially mimics the structures of the Bi2212 and Bi2223 phase where the easy cleavage between the weakly bonded Bi—O layers provides the self-alignment property during deformation. As the attraction between the "board" particles and the "roller" particles is even weaker in the proposed "roller-skate" powder structure, it would be expected that texture formation will occur at a less shear strain level than the value for texture formation in the Bi-based compounds. During sintering, the plate-like particles act as templates for textured growth of the final compound. Moreover, the formation of textured grains between the plate-like particles provides an opportunity to structurally adjust possible mismatches between the plate-like particles. For oxide superconducting materials sensitive to grain boundary mismatch, this provides an extra mechanism for strongly coupled grain boundaries and hence an improved critical current density. Therefore, the present invention provides a generic method for the preparation of a metal matrix composite with a textured compound.

The volume fractions of the two powders can be estimated from a simplified model. Suppose the plate-like particle has a thickness $t_1$ and the second powder has a packing density $\rho_2$ and a particle size of $d_2$. Imagine that we can cut the powder into vertical slices and within each slice we can rearrange the plate-like particles so that the plate-like particle can form complete layers with the second powder between them. If the number of second powder particles in between is n, then the volume fraction $f_1$ of the plate-like powder is:

$f_1 = t_1/(t_1 + nd_2\rho_2) = 1/(1 nd_2\rho_2/t_1)$    Equation (1)

The choice of the volume fraction of the plate-like powder is a complex issue. A suitable value should provide an adequate amount of texture templates without any significant decrease in the powder flowability. Equation (1) can serve as a general guideline for the volume fraction of the plate-like powder. Assume a typical value for $\rho_2$ as 74% and the particle size of the second powder equals the thickness of the first powder, we can calculate some typical values as shown in Table 1. Similar calculations can be performed for other conditions, such as the values in Table 2. An n value of about 2 or greater can be used. A larger n value will be used for a relatively smaller particle size of the second powder. For example, the $f_1$ value of 93% in Table 2 may be difficult since bridging would occur for the first powder at this high volume fraction. The upper limit will be around the possible packing density of the plate-like powder alone. The volume fraction of the first powder would be in the range of 10 to 80% for most powders.

TABLE 1

Volume fraction of plate-like powder ($d_2/t_1 = 1$)

| n | 1 | 2 | 3 | 4 | 5 | 10 | 20 |
|---|---|---|---|---|---|----|----|
| $f_1$ (%) | 57 | 40 | 31 | 25 | 21 | 12 | 6 |

TABLE 2

Volume fraction of plate-like powder ($d_2/t_1 = 0.1$)

| n | 1 | 2 | 3 | 4 | 5 | 10 | 20 |
|---|---|---|---|---|---|----|----|
| $f_1$ (%) | 93 | 87 | 82 | 77 | 73 | 57 | 40 |

The choices of the particle size and shape of the powders are important considerations. For the plate-like powder, the dimension ratio between basal plane and thickness is preferably greater than 3. The particle size of the plate-like powder (measured on the average dimension of the basal plane) should be in the range of microns to tens of microns. The particle size of the second powder is preferably less than 20% of the particle size of the first powder, or in the range of microns and even smaller size. The particle size of the second powder can be controlled by grinding.

The components for the second powder can be prepared separately and then mixed together, or they can be prepared in a single powder batch. The second powder may contain particles of different size as shown in FIGS. 3A–B to obtain a high packing density.

In another aspect of the invention, the second powder further comprises at least one deformable phase so that it will facilitate the deformation of the whole powder. By deformable it is meant that the phase will either deform plastically without destruction or the particles break up into smaller pieces under the deformation process.

In still another aspect of the invention, the second powder further comprises a component or components that form a transient liquid phase during the sintering process. Such liquid forming phases include low melting components, eutectic liquid phase, and specially added liquid forming metal salts. This liquid phase will help the sintering process, and more importantly provide a mechanism for grain boundary adjustment so that low energy special grain boundaries will be formed. This will be of particular importance to many oxide superconductors.

In a preferred embodiment, the second powder comprises at least one metallic or alloy component so that a mixed mode of in situ and ex situ mechanisms is provided. This will take advantage of the merits of both mechanisms. For example, for oxide superconductors, the first powder is a plate-like oxide superconductor, and the second powder comprises the metallic powders of appropriate composition. The two powders are mixed to form a starting powder. Then the starting powder is used to make a composite wire according to the deformation process of the "powder-in-tube" process to develop texture in the plate-like particles. The metallic powder is converted into oxides during the sintering process. As the plate-like particles will act as templates for the formation of the intended final oxide superconductor, highly textured superconductor grains will be formed with a high critical current density. The amount of the metallic powder in the second powder can also be adjusted as needed.

Similarly, for $MgB_2$, the first powder is plate-like $MgB_2$ particles, and the second powder contains Mg and B particles. B can even exist in an alloy or compound and the extra element in the alloy or compound can diffuse into the sheath material or simply exist as second phases.

In another preferred embodiment, the process to make a composite is the powder-in-tube method. A composite wire is prepared by filling the starting powder into a metal tube and reducing the cross section of the tube through mechanical deformation such as swaging, rolling, extrusion, or drawing, and for a multifilamentary wire, assembling the previously formed bundles and further deforming the assembly into a multifilamentary wire. The plate-like powder is textured during the deformation process. After sintering, improved properties are obtained due to the template texture formation.

A composite can also be prepared by other known composite processing methods, such as dip coating, tape casting, spray coating, liquid metal infiltration, and multi-layer layout.

In still another aspect of the invention, the powder is pre-textured before the major reduction process of the composite. The pre-texture operation can be accomplished by any mechanical means or magnetic alignment due to the anisotropy of magnetic properties of the plate-like powder. When a pre-textured powder is used, high reduction rolling is not necessary to achieve a high degree of texture. Therefore, instead of preparing composites in the tape form, composite wires with low aspect ratios can be prepared by more uniform deformation methods such as drawing and extrusion. The pre-textured powder also allows for the use of a variety of composite preparation methods without deformation. The pre-texture powder precursor can also be used to prepare highly textured bulk compound with improved physical properties.

By "texture" as the term is used herein, it is meant that the layered compound grains have been aligned with the basal plane to a significant degree. If the phases of the second powder are different from the first powder, the texture of the plate-like powder can be easily quantified using the lotgering factor, or f-factor from the X-ray diffraction pattern of the material with a value of zero for random orientation and a value of 1 for perfect alignment. In preferred embodiments, the f-factor has a value of at least 0.6, more preferably 0.8, and most preferably 0.9. If the phase of the first powder is also included in the second powder, the texture information of the first powder may be difficult to determine due to contribution of the second powder to the X-ray diffraction pattern. If the orientation of the second powder is random, the texture information of the first powder can be obtained by certain calculation.

Otherwise, direct observation of the microstructure can provide information about the alignment. In preferred embodiments, at least 60% of the plate-like particles are within 10 degrees of the intended alignment, and this number should reach more preferably 80% and most preferably 90%.

In a preferred embodiment, the metal matrix composite is in the form of a wire. By "wire" as the term is used herein, it is meant an elongated article with its length dimension significantly (at least 2 times and normally orders of magnitude) larger than the dimensions of the cross section. It is equivalent to a tape, a ribbon, a rod, or the like, used in the literature.

In preferred embodiments, the layered compound is a layered superconducting material. Intermetallic compound $MgB_2$, rare earth RBaCuO-123 oxide superconductor (where R is an element or mixture of elements of Y, La, Nd, Sm, Eu, Gd, Tb, Dy, Ho, Er, Tm, Yb, and Lu), Bi-based (Bi,Pb)SrCaCuO-2223 and (Bi,Pb) SrCaCuO-2212 oxide superconductors, Tl-based oxide superconductors, and Hg-based oxide superconductors, are all layered superconducting materials.

In a preferred embodiment for preparing layered superconductors, the layered superconducting material is pre-textured for the preparation of the superconducting material. This allows for the use of a variety of composite preparation methods with more uniform deformation process and even no deformation process at all. For example, low aspect ratio superconducting wires can be prepared from textured feeding bar using the drawing process. FIGS. 5A–C show some of the low aspect ratio configurations.

An advantage of the powder structure of the present invention for the preparation of a layered oxide superconducting composite is that inexpensive metal substrate materials can be used instead of silver-based materials. A metallic material can be coated with an oxygen diffusion barrier layer such as a metal oxide and used as the substrate for the superconducting materials. Such metallic materials include carbon steel, stainless steel, superalloys, nickel-based materials, copper-based materials, and titanium-based materials. Since the texture formation mechanism is independent of the substrate material, more choice of substrate materials and barrier layer preparation methods are available, which in turn expands the temperature ranges and related processing methods. In addition, the superconducting layer can be made much thicker than what can be achieved in the coated superconductor method.

DETAILED DESCRIPTION

Figure 1A:
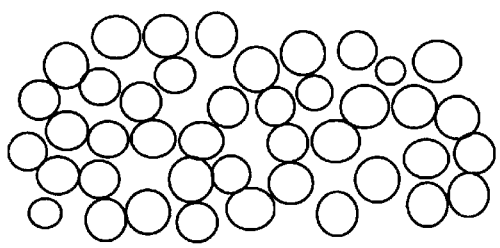
FIGS. 1A–B show the structures of a near-sphere powder in the loose powder state and packed state respectively (prior art).
Figure 1B:
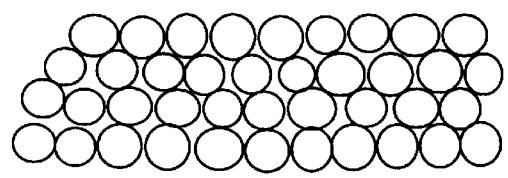
Figure 2A:
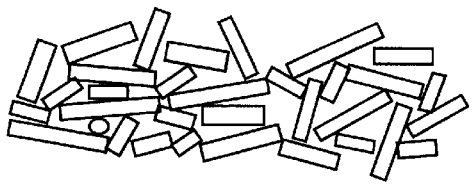
FIGS. 2A–B show the structures of a plate-like powder in the loose powder state and packed state respectively (prior art).
Figure 2B:
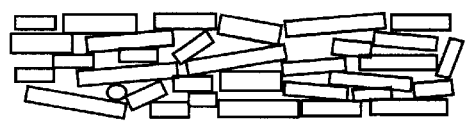

The present invention uses a "roller-skate" structure starting powder with a mixture of plate-like particles and smaller particles. The plate-like powder can be prepared by well-known ceramic powder processing methods such as freeze drying, spray pyrolysis, co-precipitation, and co-decomposition, and solid state reaction. Due to the layered structure of the compound, it has a tendency to form the plate-like particles, and the desired particle shape will form at suitable processing conditions such as melt-texturing and other liquid assisted processes. U.S. Pat. No. 5,086,034 by U. Balachandran, et al. describes a method to prepare fine 123 powders with a low carbon content, U.S. Pat. No. 5,096,879 by R. H. Arendt presents a method to prepare plate-like Bi2212 powder in a molten salt, U.S. Pat. No. 5,356,868 by N. Naito et al. shows platelet Y123 powder prepared by partial melt, U.S. Pat. No. 5,395,821 by D. M. Kroeger et al. teaches an aerosol pyrolysis process to prepare fine Bi-based powders, U.S. Pat. No. 5,614,472 by R. Riddle et al. discloses a spray pyrolyric process for the preparation of multi-element metal oxide powders, and U.S. Pat. No. 5,863,867 by S. Sengupta et al. describes a method to make a fine Bi-based powder by chemical precipitation and low-pressure calcination. These powder preparation methods are hereby incorporated by reference. In a preferred embodiment, the two different particles are prepared separately and then mixed together in appropriate proportion to form the starting powder. In the preparation of the plate-like particles, it is not necessary to prepare a single phase, and there may be other phases mixed herein. The starting powder is used for the preparation of a metal matrix composite with a textured compound.

The method of the invention can be used for the processing of (Bi,Pb)SrCaCuO-2223 superconducting wires. Both the (Bi,Pb)SrCaCuO-2223 phase and the (Bi,Pb) SrCaCuO-2212 phase can be used for the plate-like particles. The (Bi,Pb)SrCaCuO-2212 phase used as the template is preferably fully doped with a Pb content within ±15%, and more preferably ±10%, and most preferably ±5%, of the final composition. However, a lower Pb content may be used depending on the sintering condition. As long as the phase is at least metastable at the initial sintering stages, it can serve as the template for the texture growth of the 2223 phase.

The plate-like particles may have a thickness around 1 μm and a width around 4 μm. The second powder comprises under-doped (Bi,Pb)SrCaCuO-2212 with Pb content less than 50%, and preferably less than 10% of the final composition, and nonsuperconducting phases. The particle size of the second powder is controlled to less than around 1 μm, for example, by grinding. Around 20–30% by volume of the first powder is mixed with the second powder to form a starting precursor powder. The starting precursor powder is used to make textured superconducting wires. Further details can be found in U.S. Pat. No. 6,265,354 entitled Method of Preparing Bismuth Oxide Superconductor, the contents of which are incorporated by reference. The operation of composite preparation and deformation process in this reference can be adapted for the preparation of superconducting wires discussed in this specification. As the texture formation is no longer solely dependent on the cleavage of the 2212 phase under large rolling reduction ratios, this offers more flexibility in the choice of deformation parameters.

The phase composition of the second powder can be engineered to improve the deformation and sintering performance. For example, it is known that a small amount of liquid forming phases such as CaO, $K_2O$, $CaF_2$, and KF, can be added to improve the sintering performance. These additives can either be incorporated into the structure of the final compound if they are within their solubility limits, or exist as second phases, preferably in the form of isolated small particles.

The method of the invention can be used for the processing of (Bi,Pb)SrCaCuO-2212 superconducting wires. As the (Bi,Pb)SrCaCuO-2212 phase is thermodynamically stable, melt-texture growth method is usually used to prepare (Bi,Pb)SrCaCuO-2212 wires in the prior art. During melt-texture growth processing, the sample is heated above the melting temperature of the (Bi,Pb)SrCaCuO-2212 phase and then undergoes a slow cooling stage. Any texture of the starting powder is lost in the melting process.

Figure 3A:
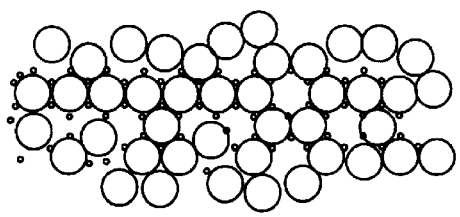
FIGS. 3A–B show the structures of a bimodal near-sphere powder in the loose powder state and packed state respectively (prior art).
Figure 3B:
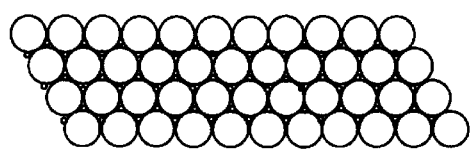
Figure 4A:
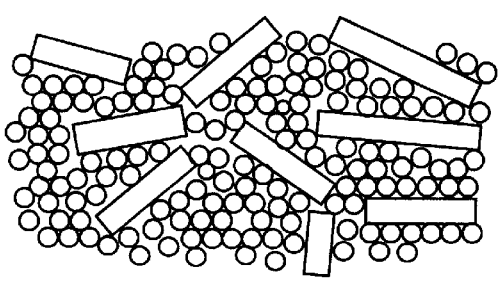
FIGS. 4A–B show the structures Structure of a "roller-skate" powder with a mixture of plate-like particles and smaller near-sphere particles, in the loose powder state and packed state respectively.
Figure 4B:
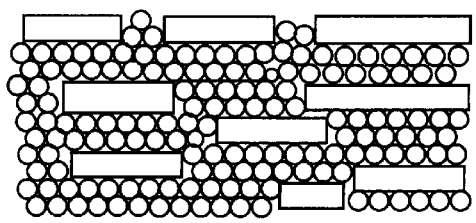

Pure oxygen is used as the processing atmosphere in order to prevent the excess growth of certain nonsuperconducting phase. For a recent example of the prior art process, please refer to "Fabrication of High Current Carrying Bi-2212/Ag Superconducting Tapes by the Pre-Annealing and Cold Rolling Process" by H. Miao et al., Cryogenics, 38, 1998, p257–259. A powder structure shown in FIG. 3A can be used to improve the packing density and deformation behavior of the powder.

Alternatively, the roller-skate powder can be used in a different processing route for (Bi,Pb)SrCaCuO-2212 superconducting wires, which is similar to the processing route for (Bi,Pb)SrCaCuO-2223 superconducting wires. The (Bi,Pb)SrCaCuO-2212 phase used as the template is preferably fully doped with a Pb content within ±15%, and more preferably ±10%, and most preferably ±5%, of the final composition. The second powder comprises under-doped (Bi,Pb)SrCaCuO-2212 phase with a Pb content less than 50%, and preferably less than 10% of the final composition. The under-doped (Bi,Pb)SrCaCuO-2212 phase and related nonsuperconducting phases in the second powder will form a transient liquid at a sintering temperature below the melting temperature of the (Bi,Pb)SrCaCuO-2212 phase. The textured (Bi,Pb)SrCaCuO-2212 phase developed during the deformation process can act as a template for the texture formation. The plate-like particles of the (Bi,Pb)SrCaCuO-2212 phase also prevent the harmful excess growth of nonsuperconducting phases since any excess growth perpendicular to the basal plane will be terminated at the boundary of the plate-like particles. Therefore, this route offers the possibility of using other processing atmospheres.

The method of the invention can be used for the processing of RBaCuO-123 superconducting composite wires. In this case, the plate-like particles are the RBaCuO-123 phase or its solid solution. The second powder may comprise RBaCuO-123 phase powder, metallic powder or alloy powder of the cations, simple oxides and complex oxides of the cations, and small amount of liquid forming dopants. It should be pointed out that various efforts to make RBaCuO-123 wires by the powder-in-tube method can only obtain a very low critical current density of around 1000 A/cm$^2$ (77K, self magnetic field).

In one embodiment, the plate-like particles are NdBaCuO-123. In the second powder, there are Nd-rich NdBaCuO-123 solid solution and $BaCuO_2$ phases. The $BaCuO_2$ phase can form a liquid at around 850° C. under an oxygen partial pressure of around $10^{-3}$ atm. Sintering at this condition will provide a transient liquid sintering condition. In another embodiment, metallic powders of Nd, Ba, and Cu are included in the second powder, which provide a better deformation performance, a higher initial density, and a transient liquid at the sintering temperature above around 840° C. A low oxygen partial pressure or inert atmosphere may be used at the initial stage to preserve the liquid forming of the metal powders and then a proper oxygen partial pressure is used for the formation of the 123 phase. Those skilled in the art can also utilize other liquid formation mechanisms disclosed in the literature. After sintering, the superconducting wire is treated in oxygen at around 300–450° C. in oxygen to make the NdBaCuO-123 phase with the proper oxygen content of the superconducting material. As the NdBaCuO-123 phase is formed at a low oxygen partial pressure, annealing in oxygen will introduce precipitates as flux pinning centers for an improved critical current density, as discussed in H. Wu et al., "Mechanism for flux pinning in $NdBa_2Cu_3O_x$ melt-textured in low oxygen partial pressure", Appl. Phys. Lett. 71,1997, p3572–3575, which is incorporated by reference. Although Nd is the preferred element from performance and cost considerations, Nd can be substituted by another light rare earth element such as Sm or a mixture of rare earth elements with an equivalent cation size in the range of a light rare earth element (La, Nd, Sm, Eu, and Gd).

Texture formation is a necessary but not sufficient condition for a high critical current density for the 123 compounds. In a prior art effort J. A. Lewis and M. Wegmann, "Transport properties of magnetic field/liquid assisted textured $YBa_2 Cu_3O_{7-x}$ thick films", Appl. Phys. Lett., 67 (20), 3028–3031, 1995), YBaCuO-123 grains were magnetically textured and sintered to a high density, the obtained critical current density was low but retained most of the initial value at a high magnetic field of 3T at 77K. This suggests that only a very small number of grains are actually connected to carry the super-current despite the good field performance. For (Bi,Pb) SrCaCuO-2223, a critical current density of around 20–50 kA/cm$^2$ (77K, zero field) is normally obtained in the prior art due to the better grain connectivity caused by the liquid assisted sintering process in the processing of (Bi,Pb) SrCaCuO-2223. The present invention, first, provides templates for texture formation. Second, liquid sintering provides a condition for grain boundaries to adjust themselves to low energy configurations. Third, the space between the template particles provides a condition for the grains to adopt a series of low energy configurations to accommodate the grain boundary mismatches. It is known that low angle grain boundaries and certain special high angle boundaries can carry very large critical current density. A condition similar to the melt-texture growth is created at a local level. This last feature will also help to further improve the superconducting performance of Bi-based superconductors. When the conditions are provided, thermodynamics will do the job to produce the better grain connectivity for a high critical current density.

The method of the invention can be used for the processing of MgB$_2$ superconducting wires. In this case, the plate-like particles are MgB$_2$. The phase composition for the second powder may be MgB$_2$, or a mixture of Mg and B, or a mixture of MgB$_2$, Mg, and B. Certain component can even exist in an alloy or compound. As the superconducting phase is formed, the extra component may enter the metal sheath or exist as a second phase. This is opposite to the "bronze method" for the preparation of Nb$_3$Sn where a component Sn goes from the bronze sheath to the superconducting material. Possible sheath materials include copper and copper alloys, silver and silver alloys, niobium and niobium alloys, and stainless steel. The sintering is performed in inert atmosphere at a temperature of 600–1000° C. depending on the sheath material and the powder condition.

The method of the invention can be used for the processing of superconducting wires with a pre-textured starting powder. The plate-like particles of the starting powder according to the present invention can be aligned prior to the major deformation process of the composite. In one embodiment, the starting powder is mixed with a binder to form a slurry. The slurry is extruded into a bar and the bar can be further rolled to improve texture. Total reduction of at least 40% is used to develop texture in the powder. After binder burnout, the powder bar is used as the feeding material for the preparation of superconducting wires by the drawing process. In another embodiment, the slurry is tape cast on to a metal substrate tape and texture is formed during the tape casting processing. The texture can be further improved by rolling of the green tape or rolling of the composite tape. In still another embodiment, the composite tape prepared above, after debinding, is coiled into a jelly-roll. The jelly-roll is further reduced into a wire by the wire drawing process (FIG. 5C).

The present invention is further illustrated by the following examples.

EXAMPLE 1

This example will show how to make a superconducting wire with a low aspect ratio. The composition has a cation ratio of Bi, Pb, Sr, Ca and Cu of 1.75:0.35:2.0:1.0:2.0. Powders of this composition is prepared by a freeze-drying method. The powder is calcined at about 800° C. in flowing 1% oxygen (balance nitrogen) at ambient pressure. This powder has the fully doped (Bi,Pb)SrCaCuO-2212 phase with plate-like shape. The particle size is controlled to around 5 μm with a width over thickness ratio greater than 3 for the majority of the particles by adjusting the calcination condition. A balance powder is prepared so that 35% by weight of the first powder can be mixed with the first powder to give a final composition of cation ratio Bi, Pb, Sr, Ca and Cu of 1.75:0.35:1.90:2.05:3.05. The balance powder is calcined in flowing pure oxygen at ambient pressure at 800° C. and the particle size is controlled to less than 1 μm by grinding. The two powders are mixed with appropriate amounts of binder, plasticizer and solvent to form a slurry. See U.S. Pat. No. 6,265,354 for details.

The slurry is extruded into a bar with a diameter of about 10 mm and the bar is rolled into a tape with a thickness of 1.5 mm. Texture is developed during the rolling process. The tape is cut into slices for fitting into the configuration shown in FIG. 5A. The slices are put on to substrates with the proper curvatures for binder burn-out. The prepared slices can be put into an extruded silver tube with a diameter of 12 mm and a configuration shown in FIG. 5A. The composite is sealed and drawn into a wire with a diameter of 0.8 mm. The wire is sintered at around 830° C. in 10% oxygen for 50 to 100 hours. A drawing deformation with reduction of around 10% may be added after sintering for around 5 to 10 hours. The difference between the present method and prior art methods is that the pre-textured starting powder allows for a good flow compatibility with the metal matrix and a high packing density. This separation of the texture formation from the composite deformation offers flexibility in the choice of composite manufacturing methods.

EXAMPLE 2

Figure 5A:
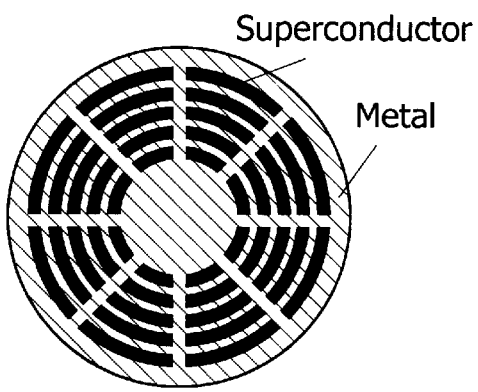
FIGS. 5A–C show different arrangements of low aspect ratio superconducting wires.
Figure 5B:
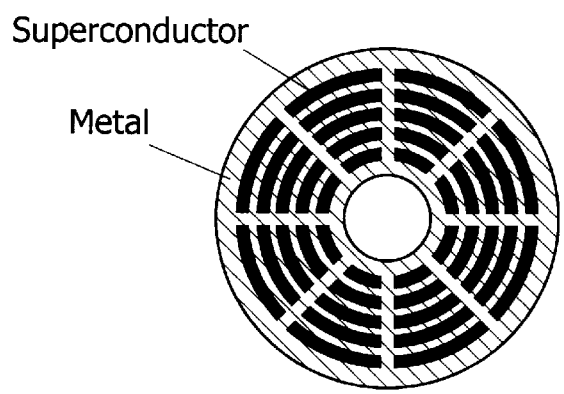
Figure 5C:
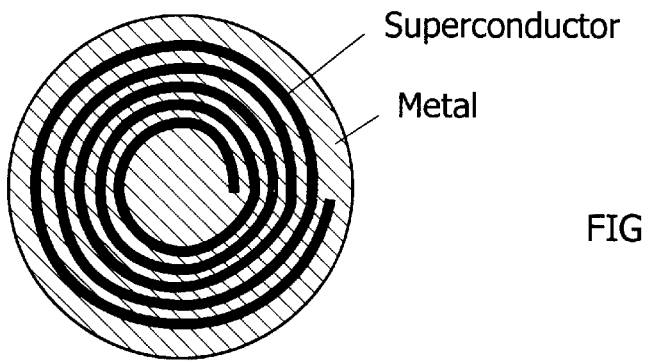

As the central part of the wire shown in FIG. 5A is not used to pack superconducting materials, the central part can be made empty. A superconducting tubing is prepared as shown in FIG. 5B by following similar processing procedures in Example 1. Since the texture orientation changes in the round wires shown in FIGS. 5A–C, the grain size of the final superconducting phase should be small enough so that the orientation mismatch between adjacent grains should be smaller than the critical mismatch angle of around 5–10°.

EXAMPLE 3

Figure 6A:
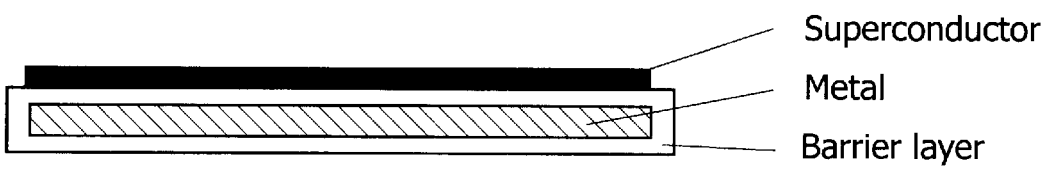
FIGS. 6A–B show structures of superconducting composite tapes with an oxygen diffusion barrier layer.

The slurry in Example 1 can be adjusted to a viscosity suitable for tape casting. Then the slurry is tape cast onto a metal substrate with an oxygen diffusion barrier layer (MgO) as shown in FIG. 6A. The thickness of the green tape is about 50 μm. Texture is formed in the tape casting process. The texture can be further improved by rolling of the composite tape. After binder burnout, the composite tape is sintered at around 830° C. in 10% oxygen for 50 to 100 hours.

Figure 6B:
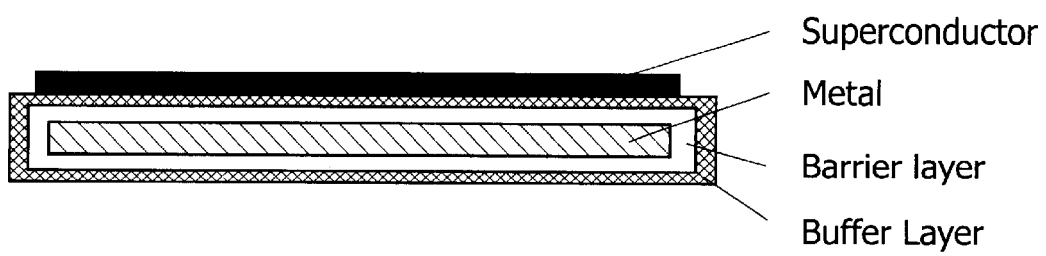

If the oxygen diffusion barrier layer is not well compatible with the superconducting material, a buffer layer can be added, as shown in FIG. 6B. There are plenty of studies of various buffer layers in association with the research on coated RBaCuO-123, which can be adapted for the preparation of the barrier layer and buffer layer in this example.

When not specified, the term buffer layer may refer to all the materials between the metal substrate and the superconducting material. A typical buffer layer structure is CeO/YSZ/CeO. However, since the texture formation mechanism in the present invention is independent of the buffer layer, texture in the buffer layer is not required. Therefore, simpler rapid buffer layer preparation methods and more choice of substrate materials are available. When substrate materials with higher melting temperatures are used, the processing temperature window may be also increased for the superconducting material.

EXAMPLE 4

It should be noted that prior results with RBaCuO-123 powder-in-tube methods are not good. The primary reason may be the lack of easy cleavage which exists in the Bi-based superconductors. The "roller-skate" powder structure in the present invention can solve the problem.

$NdBa_2Cu_3Ox$ powder is prepared by a freeze-drying method. The calcination is performed at around 900° C. in a flowing gas of a low oxygen partial pressure of 0.1% oxygen at ambient pressure. The as formed particles are plate-like with a particle size of around 5 $\mu$m and the thickness of plate less than 1 $\mu$m. This powder will serve as the "board" of the "roller-skate" structure. A part of the powder is ground to less than 1 $\mu$m in particle size. Metal powder of Nd, Ba, and Cu in the cation ratio of 1:2:3 is also prepared by high energy grinding to a particle size of less than 1 $\mu$m. The three powders are mixed with about equal molar fraction to form a starting precursor powder.

The precursor powder is filled into a silver or silver alloy tube of 25 mm outer diameter and 22 mm in inner diameter, which in turn is swaged into 12 mm in diameter, drawn into 1 mm in diameter, and then rolled into 0.20 mm in thickness.

The reduction ratio for each pass is around 20%. For a 19 filament multifilamentary wire, the single filament wire discussed above is cut into 19 sections of equal length when the diameter is 4.0 mm. The single filament sections are packed into a silver or silver alloy tube of 25 mm in outer diameter and 22 mm in inner diameter, which in turn is swaged into 12 mm in diameter, drawn into 1 mm in diameter, and then rolled into 0.20 mm in thickness. The reduction ratio for each pass is around 20%. The rolling process introduces texture in the plate-type powder.

As-formed tape-type wires are heat treated at about 850–870° C. in industrial nitrogen atmosphere at ambient pressure (oxygen partial pressure of around 50 ppm) for around 2 hours, again rolled into 0.18 mm in thickness, and thereafter heat treated at about 850–870° C. for 24 hours in 0.1% oxygen at ambient pressure, and cooled to around 350–450° C. and treated at this temperature in oxygen for around 48 hours. The oxygen annealing will ensure the proper oxygen content of the superconducting phase for a high transition temperature and at the same time introduce flux pinning centers in the material.

All publications mentioned in this specifications are herein incorporated by reference to the same extent as if each independent publication was specifically and individually indicated to be incorporated by reference.

What is claimed is:

1. A method of preparing a metal matrix composite with a textured compound by adding the starting powder to a metal matrix and, by a powder process characterized in that:
   (a) providing the said starting powder with a "roller-skate" structure comprising a mixture of a first plate-like powder with an at least metastable phase and a second powder with a particle size smaller than half the median minimum dimension of the basal plane of said first powder;
   (b) providing a texturing operation to said first plate-like powder;
   with improved flow compatibility, higher packing density, densification and texture formation of said textured compound as compared to textured compound produced from non-roller-skate starting powder;
   whereby said first plate-like powder acts as templates for the texture formation of said textured compound during sintering.

2. The method of claim 1, wherein the volume fraction of said first plate-like powder has a predetermined value within a range of from 10% to 80%.

3. The method of claim 1, wherein the dimension ratio between the basal plane and thickness of said first plate-like powder is greater than 3.

4. The method of claim 1, wherein said first plate-like powder has the phase of said textured compound.

5. The method of claim 1, wherein the particle size of said second powder is less than 20% of the particle size of said first plate-like powder.

6. The method of claim 1, wherein said second powder further contains at least one deformable component.

7. The method of claim 6, wherein said deformable component is a metallic powder.

8. The method of claim 7, further comprising of a deformation of the said second powder, whereby the deformation is carried out by a mixed mode of in-situ and ex-situ processes.

9. The method of claim 1, wherein said second powder further provides a transient liquid phase during the sintering process.

10. The method of claim 1, wherein said starting powder is pre-textured before the deformation process of said metal matrix composite.

11. The method of claim 1, wherein said textured compound is a layered superconducting compound.

12. The method of claim 11, wherein said layered superconducting compound is chosen from the group of oxide superconductors consisting of RBaCuO-123 oxide superconductors, Bi-based (Bi,Pb)SrCaCuO-2223 and (Bi,Pb)SrCaCuO-2212 oxide superconductors, Tl-based oxide superconductors, and Hg-based oxide superconductors.

13. The method of claim 11, wherein said layered superconducting compound is $MgB_2$.

14. The method of claim 12, wherein said metal matrix is further surrounded by a buffer layer.

15. A method of preparing a metal matrix composite wire with a textured superconductor, comprising the steps of:
   (a) preparing a starting powder with a "roller-skate" structure comprising a first plate-like powder with an at least metastable phase and a second powder with a particle size smaller than half the median minimum dimension of the basal plane of said first powder and a phase composition providing a transient liquid phase during the sintering process;

(b) filling said starting powder into a metal sheath;

(c) performing deformation processing on said metal sheath to form a composite wire and develop texture in said first plate-like powder;

(d) performing thermo-mechanical processing to obtain said textured superconductor with a high critical current density;

with improved flow compatibility, packing density, densification and texture formation of said textured superconductor as compared to textured superconductor produced from non-roller-skates starting powder;

whereby said first plate-like powder acts as templates for the texture formation of said textured superconductor during sintering.

16. The method of preparing a metal matrix composite wire with a textured superconductor of claim 15, wherein:

(a) said textured superconductor is RBaCuO-123 where R is selected from a group consisting of light rare earth element La, Nd, Sm, Eu, and Gd, or a mixture of rare earth elements with an equivalent cation size in the range of the light rare earth elements;

(b) said first plate-like powder has a phase of RBaCuO-123;

(c) said thermo-mechanical processing includes sintering at a low oxygen partial pressure for the formation of said RBaCO-123 phase with a higher R content and then annealing in oxygen to introduce precipitates as flux pinning centers;

with the formation of said textured superconductor with improved critical current density and magnetic field performance.

17. A starting powder with a "roller-skate" structure for the preparation of a metal matrix composite with a textured layered compound, the said starting compound comprising (a) a first plate-like powder with an at least metastable phase wherein the volume fraction of the said first plate-like powder has a predetermined range of at least 10% to 80% of the total powder mixture of;

(b) a second powder with a particle size smaller than half the median minimum dimension of the basal plane of said first powder;

with improved flow compatibility, higher packing density, better densification and texture formation of said compound textural layered;

whereby said first plate-like powder acts as templates for the texture formation of said compound during sintering.

18. The starting powder of claim 17, wherein said first plate-like powder has the phase of said textural layered compound.

19. The starting powder of claim 17, wherein said the first plate-like powder is layered compound chosen from the group of oxide superconductors consisting of RBaCuO-123 oxide superconductors, Bi-based (Bi,Pb)SrCaCuO-2223 and (Bi,Pb)SrCaCuO-2212 oxide superconductors, Tl-based oxide superconductors, and Hg-based oxide superconductors.

20. The starting powder of claim 17, wherein said the first plate-like powder is a layered compound of $MgB_2$.

21. The starting powder of claim 17, wherein said second powder contains at least one deformable component.

22. The starting powder of claim 21, wherein said deformable component is a metallic powder, whereby a mixed mode of in situ and ex situ processes is used to take advantage of the powder characteristics of both methods.

23. The method of claim 22, further comprising of deformation of the said second powder, whereby the deformation is carried out by a mixed mode of in-situ and ex-situ processes.

24. The starting powder of claim 17, wherein said textured layered second powder further provides a transient liquid phase during the sintering process.

25. The starting powder of claim 17, wherein said compound is a layered superconducting compound.

* * * * *